United States Patent
Won

(10) Patent No.: US 10,323,600 B2
(45) Date of Patent: Jun. 18, 2019

(54) METHOD FOR DIAGNOSING FAILURE OF POWER STAGE OF ELECTRONIC WASTE GATE ACTUATOR

(71) Applicant: Hyundai Motor Company, Seoul (KR)

(72) Inventor: Min-Kyu Won, Hwaseong-si (KR)

(73) Assignee: Hyundai Motor Company, Seoul (KR)

(*) Notice: Subject to any disclaimer, the term of this patent is extended or adjusted under 35 U.S.C. 154(b) by 210 days.

(21) Appl. No.: 15/374,718

(22) Filed: Dec. 9, 2016

(65) Prior Publication Data
US 2018/0106207 A1 Apr. 19, 2018

(30) Foreign Application Priority Data
Oct. 18, 2016 (KR) .................. 10-2016-0135066

(51) Int. Cl.
| | |
|---|---|
| *F02B 37/18* | (2006.01) |
| *F02D 41/22* | (2006.01) |
| *G01R 19/165* | (2006.01) |
| *F02D 41/20* | (2006.01) |
| *F02D 41/04* | (2006.01) |

(Continued)

(52) U.S. Cl.
CPC .......... *F02D 41/221* (2013.01); *F02B 37/183* (2013.01); *F02B 37/186* (2013.01); *F02D 41/20* (2013.01); *G01R 19/16528* (2013.01); *F02D 41/0007* (2013.01); *F02D 41/042* (2013.01); *F02D 41/2451* (2013.01); *F02D 2041/228* (2013.01); *Y02T 10/144* (2013.01); *Y02T 10/40* (2013.01)

(58) Field of Classification Search
CPC .... F02D 41/221; F02D 41/20; F02D 41/0007; F02D 41/2451; F02D 2041/228; F02D 41/042; G01R 19/16528; F02B 37/183
See application file for complete search history.

(56) References Cited

U.S. PATENT DOCUMENTS

| 5,411,289 A | * | 5/1995 | Smith ................ B60R 21/017 180/271 |
| 5,447,031 A | | 9/1995 | Betts et al. |
| 2017/0306834 A1 | * | 10/2017 | Takahashi ............ F02B 37/18 |

FOREIGN PATENT DOCUMENTS

| JP | 2003120304 A | 4/2003 |
| JP | 2011190778 A | 9/2011 |
| JP | 2014074386 A | 4/2014 |

(Continued)

OTHER PUBLICATIONS

Machine Translation of JP 2015-025409 (Year: 2015).*

*Primary Examiner* — Alan D Hutchinson
(74) *Attorney, Agent, or Firm* — Slater Matsil, LLP

(57) ABSTRACT

The present invention relates to a method for diagnosing a failure of a power stage of an electronic waste gate actuator (EWGA). According to the present invention, whether the failure of the power stage of the EWGA occurs is determined by confirming, by an engine control unit (ECU), information on the failure of the power stage transferred from an EWGA driver IC at the time of EWGA position learning, after an engine is turned off. By doing so, even when a turbo-charger is not used for a long time, whether the failure of the power stage of the EWGA occurs may be diagnosed for every driving cycle, such that a failure of the ECU may be prevented in advance and unnecessary replacement of components may be prevented, thereby decreasing maintenance costs for a vehicle.

17 Claims, 6 Drawing Sheets

(51) Int. Cl.
     *F02D 41/24*        (2006.01)
     *F02D 41/00*        (2006.01)

(56) References Cited

FOREIGN PATENT DOCUMENTS

| | | |
|---|---|---|
| JP | 2015025409 A | 2/2015 |
| KR | 20030016683 A | 3/2003 |
| KR | 20040025964 A | 3/2004 |
| KR | 101552061 B1 | 9/2015 |
| KR | 20160077560 A | 7/2016 |

\* cited by examiner

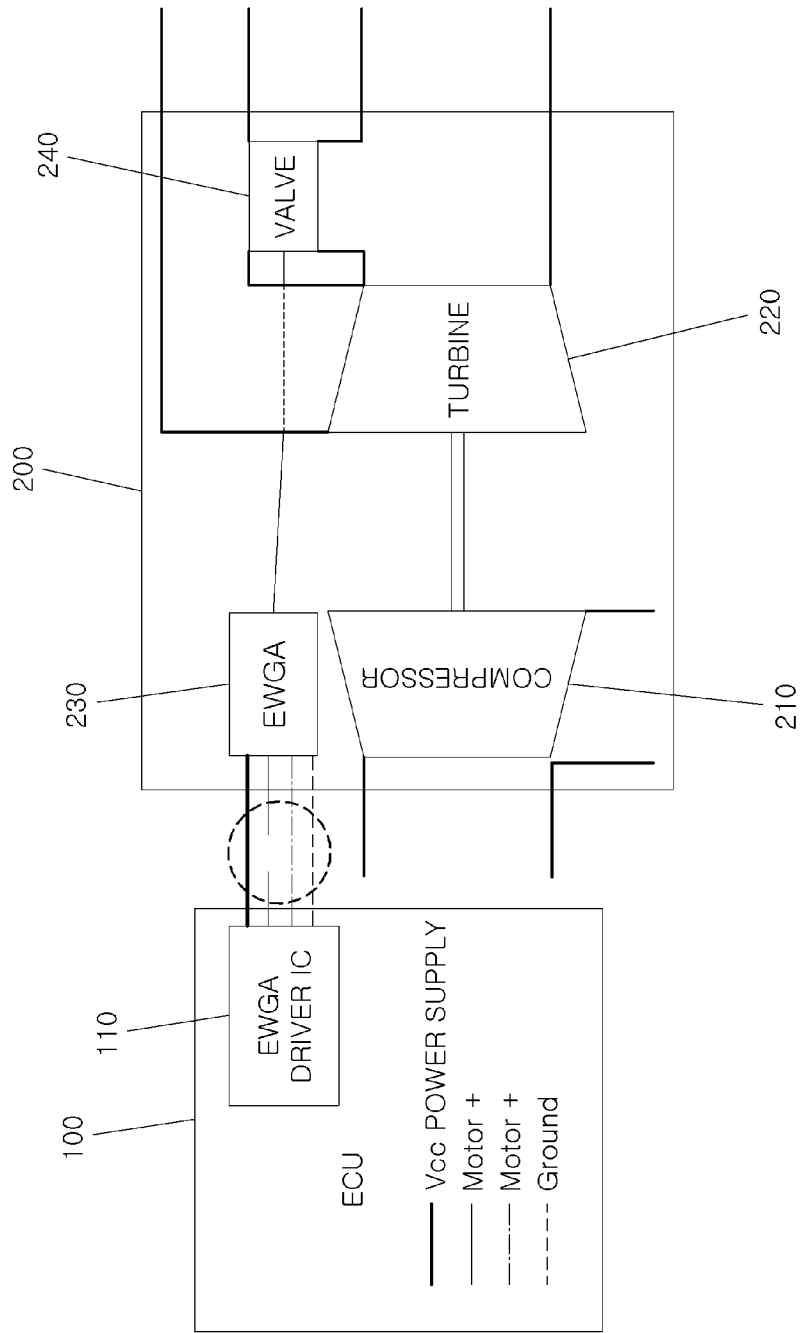

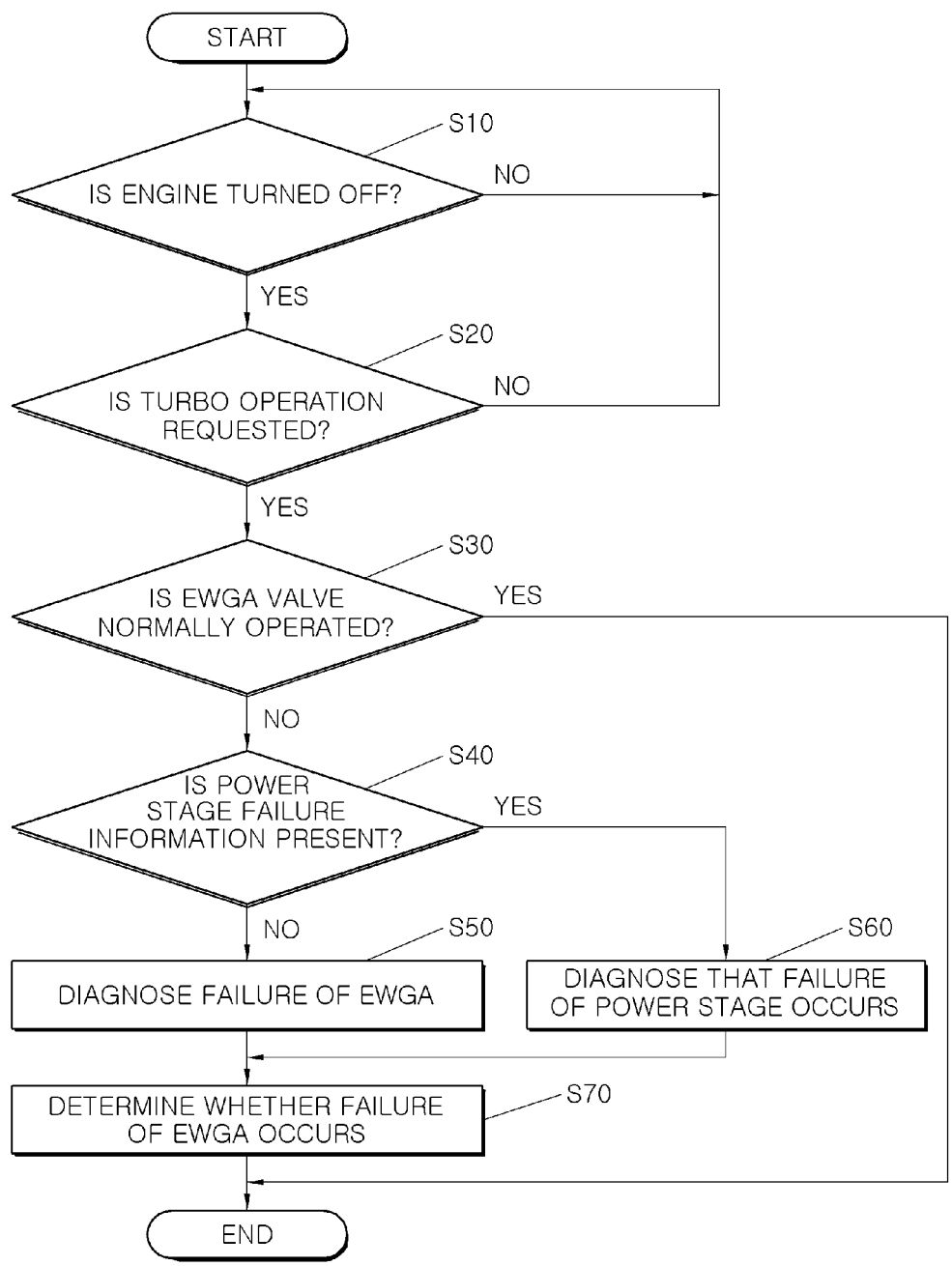

METHOD FOR DIAGNOSING FAILURE OF POWER STAGE OF ELECTRONIC WASTE GATE ACTUATOR

CROSS-REFERENCE TO RELATED APPLICATIONS

This application claims priority to Korean Patent Application No. 10-2016-0135066, filed on Oct. 18, 2016, which is incorporated herein by reference in its entirety.

TECHNICAL FIELD

Exemplary embodiment of the present invention relate to a method for diagnosing a failure of a power stage of an electronic waste gate actuator (EWGA), and more particularly, to a method for diagnosing a failure of a power stage of an electronic waste gate actuator by confirming information on the failure of the power stage transferred from a driver IC for the electronic waste gate actuator.

BACKGROUND

Recently, as oil prices have increased, a demand for improving fuel efficiency is increased, and vehicle manufacturers have been made an effort to develop a technology for improving fuel efficiency of an engine. Technical skills are concentrated on development of a turbo gasoline direct injected (GDI) vehicle capable of increasing output and downsizing the engine as one of such technology development direction.

To this end, a turbo system of a supercharging type like Patent Document 1 has been suggested. The turbo system rotates a turbine using exhaust gas and supercharges fresh air by a compressor coaxially connected to the turbine, thereby improving engine torque and fuel efficiency.

Meanwhile, an electronic waste gate actuator (EWGA) is installed in a waste gate turbo-charger to serve to control a waste gate valve of the turbo-charger depending on operation conditions. The EWGA is controlled by receiving a signal from a driver IC of an engine control unit (ECU), and diagnosing a failure of a power stage through the driver IC for the actuator is essentially required in a turbo vehicle in which the EWGA is installed according to safety laws. The power stage allows power to flow between electronic equipment in a vehicle.

Meanwhile, since whether a failure occurs is determined based on a current or a voltage in a circuit, a possibility that information on the failure of the power stage present in the EWGA driver IC is transferred even in a case of signal noise, not an actual failure may not be ruled out.

Therefore, in a case of the turbo vehicle using the EWGA that is currently on the market, as illustrated in FIG. 4, whether a failure occurs is not diagnosed by directly using the failure information of the EWGA driver IC, but only when there is a problem in controllability during driving (S30), the failure information is used to determine (S40) whether the failure of the power stage occurs.

According to the related art, the waste gate valve is driven (S20) in order to use the turbo at the time of rapid acceleration during driving or at the tine of driving at high speed. In this case, when it is determined that the valve is not normally driven (S30), whether the information on the failure of the power stage transmitted from the EWGA driver IC is present is confirmed (S40), and if the failure information is present, it is diagnosed that the failure of the power stage occurs (S60).

However, according to the related art, in a case in which the turbo is not driven since the rapid acceleration does not occur or high speed driving is not performed during a driving cycle, the failure of the power stage of the EWGA may not be diagnosed even when the failure of the power stage of the EWGA actually occurs. In this case, a severe failure may occur even in the ECU due to the failure of the power stage of the EWGA.

Further, at the time of EWGA position learning, if a learning result is abnormal, whether the failure of the power stage occurs is not considered, thus even when the valve is normal, the valve may be unnecessarily replaced, such that additional expense is generated.

The patent document Korean Patent No. 10-1552061 (Sep. 10, 2015) is related to subject matter disclosed herein.

SUMMARY

Exemplary embodiments of the present invention relate to a method for diagnosing a failure of a power stage of an electronic waste gate actuator (EWGA). For example, particular embodiments relate to a method for diagnosing a failure of a power stage of an electronic waste gate actuator by confirming information on the failure of the power stage transferred from a driver IC for the electronic waste gate actuator.

An embodiment of the present invention is directed to a method for diagnosing a failure of a power stage of an electronic waste gate actuator capable of diagnosing the failure of the power stage that may not be diagnosed according to the related art, and accurately analyzing a root cause of an abnormal learning value at the time of EWGA position learning.

In accordance with an embodiment of the present invention, in a method for diagnosing a failure of a power stage of an electronic waste gate actuator (EWGA), whether the failure of the power stage of the EWGA occurs is determined by confirming, by an engine control unit (ECU), information on the failure of the power stage transferred from an EWGA driver IC at the time of EWGA position learning, after an engine is turned off.

When it is determined that the failure of the power stage of the EWGA occurs, the ECU may notify a driver of occurrence of the failure of the power stage through an alarm message.

When it is determined that the failure of the power stage of the EWGA does not occur, a voltage applied for the EWGA position learning may be compared with a predetermined reference value to determine whether the learning voltage is abnormal.

When an input voltage applied to the EWGA is less than a predetermined minimum value at the time of the learning, the EWGA driver IC may transfer information on disconnection of the power stage to the ECU.

When an input voltage applied to the EWGA is higher than a predetermined maximum value at the time of the learning, the EWGA driver IC may transfer information on short-circuit of the power stage to the ECU.

When a learning result deviates from a normal range at the time of EWGA position learning, whether the information on the failure of the power stage is present may be confirmed.

When a current learning voltage is lower than a minimum input voltage required to control a waste gate valve at a predetermined opening degree, it may be determined that a failure of a turbo-charger occurs.

When a current learning voltage is higher than a maximum input voltage required to control a waste gate valve at a predetermined opening degree, it may be determined that a failure of a turbo-charger occurs.

When it is determined that the failure of the turbo-charger occurs, the ECU may notify a driver of failure details of the turbo-charger through an alarm message.

BRIEF DESCRIPTION OF THE DRAWINGS

FIG. 2, is a flowchart illustrating a method for diagnosing a failure of a power stage of an EWGA in accordance with an embodiment of the present invention.

FIGS. 3A and 3B are views illustrating disconnection and short-circuit of a power stage that are diagnosed by a method for diagnosing a failure of a power stage of an EWGA in accordance with an embodiment of the present invention, respectively.

FIG. 4 is a flowchart illustrating a method for diagnosing a failure of a power stage of an EWGA according to the related art.

DETAILED DESCRIPTION OF ILLUSTRATIVE EMBODIMENTS

Preferred embodiments of the present invention will be described in detail with reference to the accompanying drawings.

Figure 1:
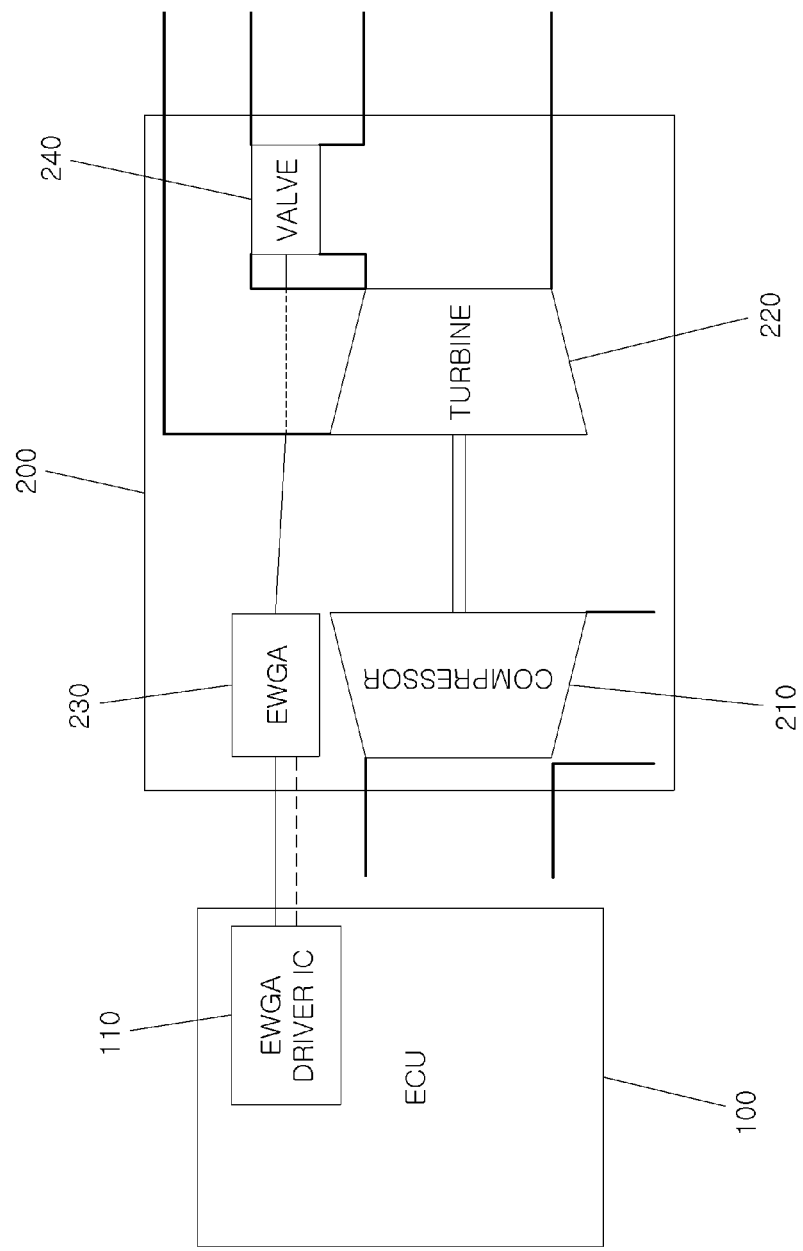
FIG. 1 is a view schematically illustrating a configuration of a turbo-charger used in a method for diagnosing a failure of a power stage of an electronic waste gate actuator (EWGA) in accordance with an embodiment of the present invention.

FIG. 1 is a view schematically illustrating a partial configuration of a turbo-charger 200 used in a method for diagnosing a failure of a power stage of an electronic waste gate actuator (EWGA) in accordance with an embodiment of the present invention.

As illustrated in FIG. 1, an electronic waste gate actuator (EWGA) 230 is mounted in the turbo-charger 200 to serve to control a waste gate valve 240 of the turbo-charger 200 depending on driving conditions.

The waste gate valve 240 is driven by the EWGA 230, and preferably includes a waste gate control flap (not illustrated) selectively supplying exhaust gas to a compressor 210 or discharging the exhaust gas into the air.

Through this, for example, under a specific condition such as acceleration, the EWGA 230 may close the waste gate valve 240 by receiving a signal from an EWGA driver IC 110 provided in an engine control unit (ECU) 100, such that all the exhaust air is supplied to a turbine 220 of the turbo-charger 200 to rotate the turbine 220 and supercharge fresh air by the compressor 210 coaxially connected to the turbine 220, thereby improving output of an engine.

Figure 2A:
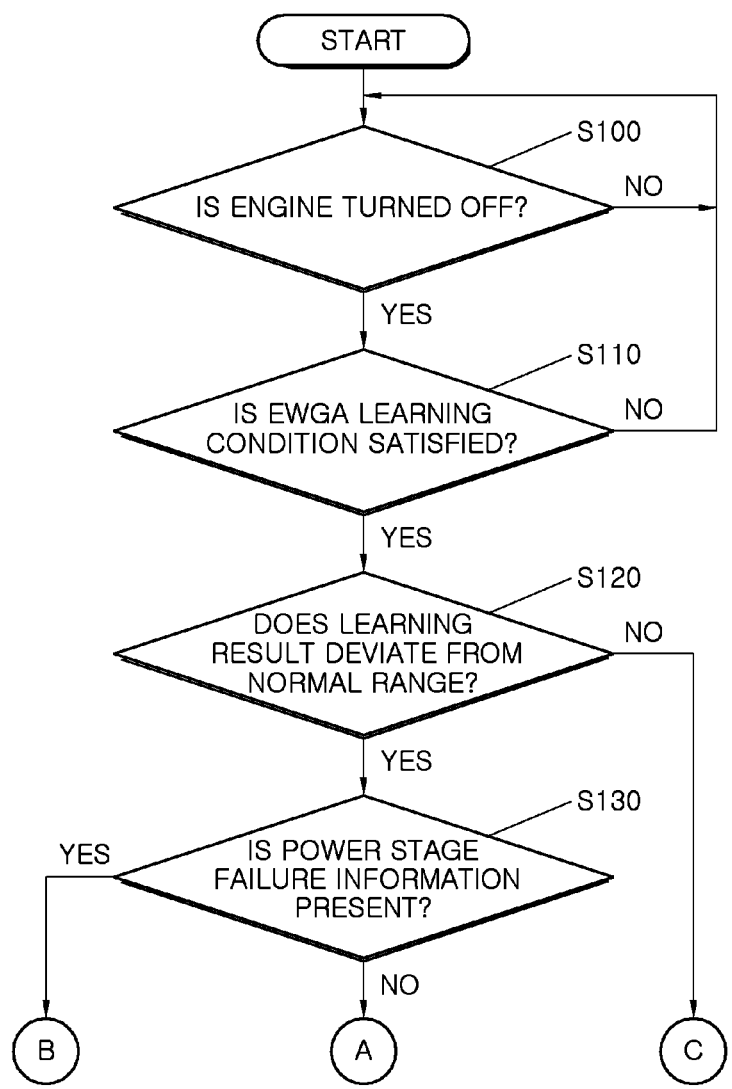
FIGS. 2A and 2B, collectively
Figure 2B:
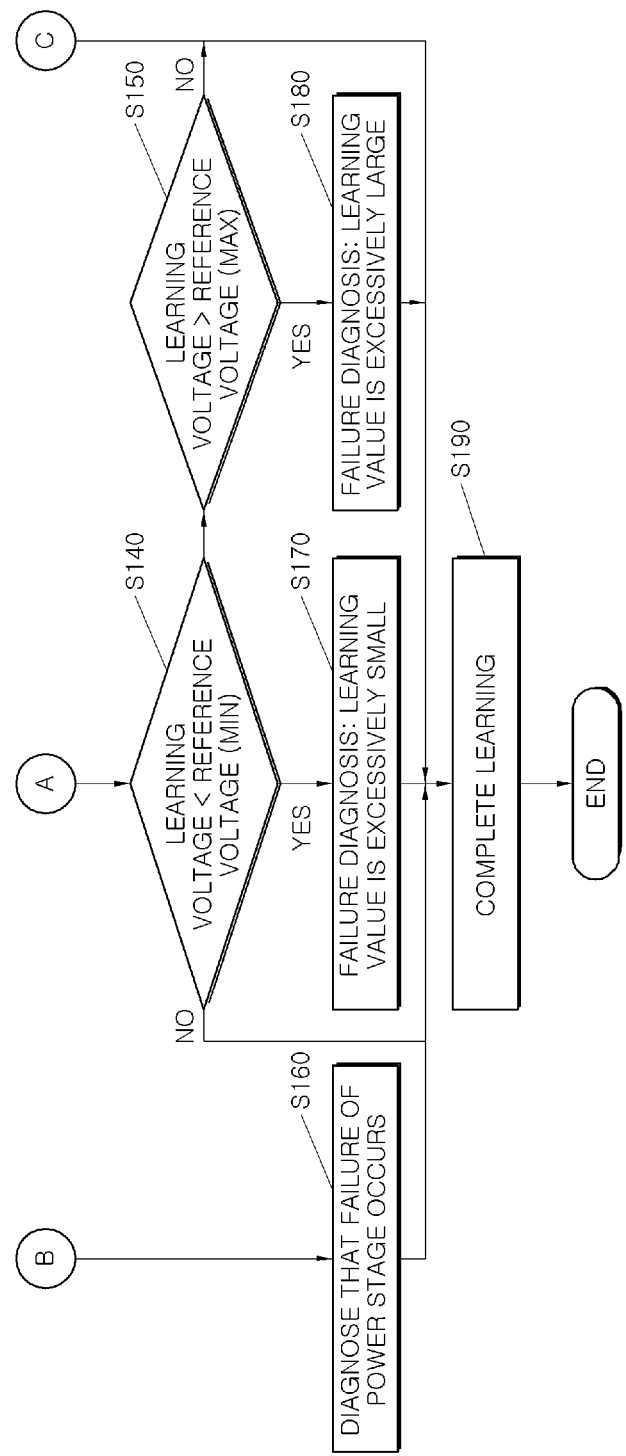

FIG. 2 is a flowchart illustrating a method for diagnosing a failure of a power stage of an EWGA in accordance with an embodiment of the present invention.

As illustrated in FIG. 2, the method for diagnosing a failure of a power stage of an EWGA in accordance with an embodiment of the present invention is performed when the ECU 100 determines whether an engine is turned off and it is determined that the engine is turned off. As described below, the method for diagnosing a failure of a power stage of an EWGA in accordance with an embodiment of the present invention is performed at the time of EWGA position learning, and the EWGA position learning is performed right after the engine is turned off. Therefore, the diagnosis of a failure of a power stage of an EWGA is also performed right after the engine is turned off.

Here, the EWGA position learning means that an actual position of the waste gate valve 240 according to a control operation amount from the EWGA driver IC is learned, in order to improve responsiveness of the EWGA 230. By allowing the waste gate valve 240 to rapidly reach a target position through the learning, it is possible to prevent a problem that a motor coil temperature is increased due to use of excessive control duty such that durability deteriorates.

When the ECU 100 determines that the engine is turned off, the ECU 100 determines whether a EWGA position learning condition is satisfied (S1lo). To this end, for example, the ECU 100 determined whether the EWGA position learning is performed before. As a determination result, if it is determined that the EWGA position learning is not performed, the EWGA driver IC 110 applies the control duty to the EWGA 230, and then the learning for checking the position of the waste gate valve 240 is performed accordingly.

Further, the ECU 100 determines whether the learning result deviates from a predetermined normal range (S120). A learning result deviated from the predetermined normal range means that the waste gate valve 240 is abnormally operated or control operation of the EWGA 230 operated by the EWGA driver IC 110 is abnormal due to a foreign material attached on the valve, an abnormal operation of a sensor for sensing the valve position, or the like.

Therefore, when it is determined that the result of the EWGA position learning deviates from the predetermined normal range, in order to determine a cause of the failure, the ECU 100 determines whether information related to the failure of the power stage is present in the EWGA driver IC 110 (S130).

Figure 3B:
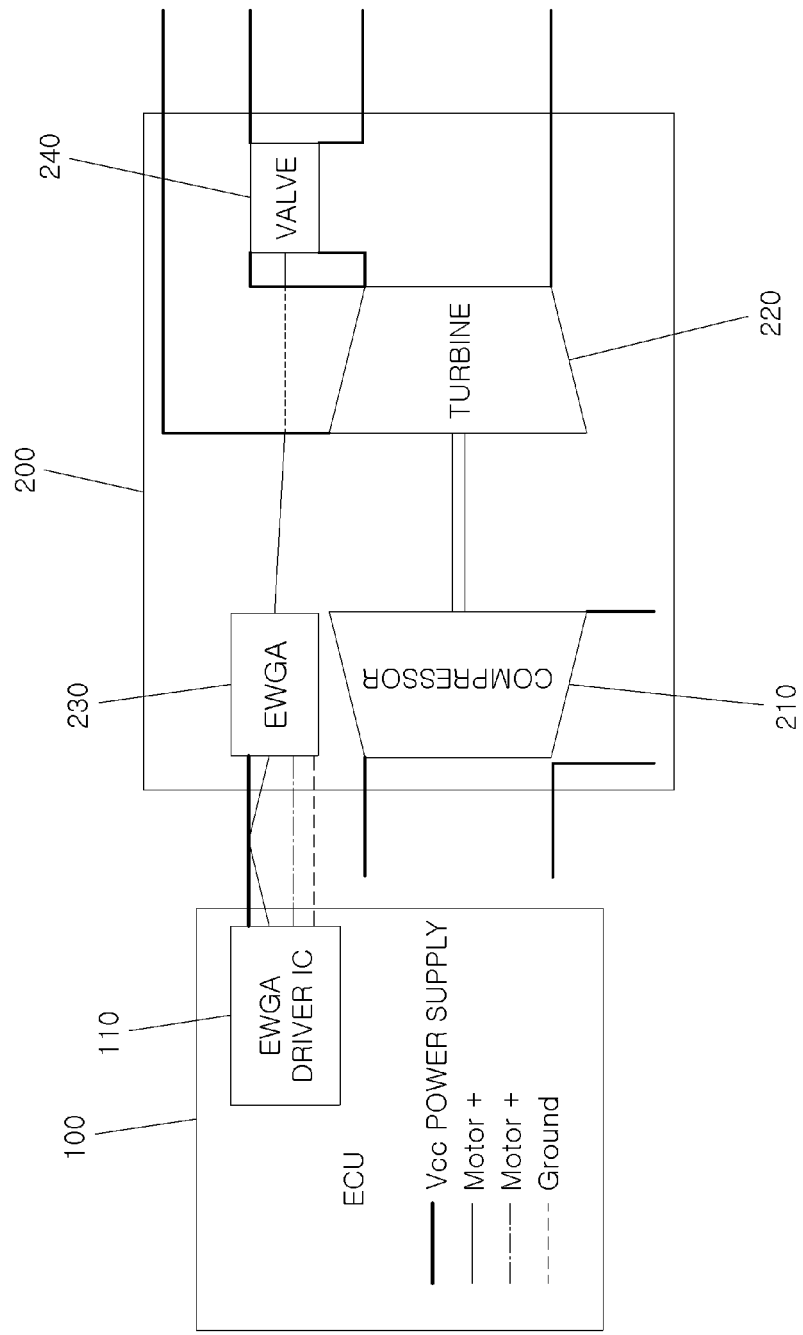

FIGS. 3A and 3B illustrate an example regarding the information related to the failure of the power stage present in the EWGA driver IC 110 in the method for diagnosing a failure of a power stage of an EWGA in accordance with an embodiment of the present invention.

FIG. 3A illustrates an example of a case in which diagnosis information "disconnection of power stage of EWGA" is present in the EWGA driver IC 110. When an input voltage of the EWGA 230 is applied as a minimum value due to disconnection of a power supply to the EWGA 230, the actuator may not be operated at the time of performing the EQGA position learning, thus the learning value may be determined to be a value outside the predetermined normal range. In this case, the EWGA driver IC 110 transfers the disconnection information to the ECU 100, and according to the method for diagnosing a failure of a power stage of an EWGA, it is determined as "disconnection of power stage of EWGA" by checking the value.

FIG. 3B illustrates an example of a case in which diagnosis information "short-circuit of power stage of EWGA" is present in the EWGA driver IC 110. When the input voltage of the EWGA 230 is applied as a maximum value due to short-circuit from the power supply to the EWGA 230 to a power supply of a battery, the learning value may be determined to be a predetermined maximum position of the valve or more at the time of performing the EWGA position learning. In this case, the EWGA driver IC 110 transfers the short-circuit information to the ECU 100, and according to the method for diagnosing a failure of a power stage of an EWGA, it is determined as "short-circuit of power stage of EWGA" by checking the value.

As described above, in the case in which the information related to the failure of the power stage is present in the EWGA driver IC 110, the ECU 100 diagnoses that the failure of the power stage of the EWGA occurs (S160), and ends the learning (S190). By doing so, even in the case in which the turbo-charger 200 is not operated for a long time, since conditions for driving of the turbo-charger 200 such as rapid acceleration or high-speed driving are not satisfied, whether the failure of the power stage of the EWGA occurs may be diagnosed by checking the failure information at the time of EWGA position learning that is performed right after every driving cycle.

In addition, preferably, when it is diagnosed that the failure of the power stage of the EWGA occurs, the ECU 100 outputs a voice message through a speaker installed in the vehicle or a text message through a screen installed in the vehicle such as a dash board, or the like, to thereby notify a driver, or the like of occurrence of the failure of the power state of the EWGA. By doing so, the driver may recognize the occurrence of the failure of the power stage of the EWGA, and may appreciate that the failure of the turbo-charger 200 is not caused by the failure of the waste gate valve 240 itself. Therefore, it is possible to clearly analyze the root cause of the failure, such that the unnecessary replacement of the normal waste gate valve 240 may be prevented.

Meanwhile, even in the case in which the information related to the failure of the power stage is not present in the EWGA driver IC 110, as described above, the learning value may be abnormal due to occurrence of the failure of the turbo-charger 200 device including the waste gate valve 240, such as a foreign material attached on the valve, an abnormal operation of a sensor for sensing the valve position, or the like.

Therefore, in a control method according to the present invention, whether the failure occurs is determined by comparing a learning voltage applied to the EWGA 230 with a predetermined reference voltage (Min value and Max value) for position control of the waste gate valve 240. The reference voltage means a range of an input voltage required to control the waste gate valve 240 at a specific opening degree.

Here, when the learning voltage is lower than a minimum reference voltage S140, it is diagnosed that the failure of the turbo-charger occurs (S170), and the learning ends (S190). For example, when the opening degree of the waste gate valve 240 is controlled to be 0% (completely closed), if the learning voltage value is lower than the minimum input voltage required for the control, it is determined that the failure occurs. The failure means a case in which a foreign material is attached to the waste gate valve 240 such that the learning voltage is lower than the originally predetermined reference voltage.

Meanwhile, when the learning voltage is higher than a maximum reference voltage S140, it is diagnosed that the failure of the turbo-charger occurs (S180), and the learning ends (S190). For example, when the opening degree of the waste gate valve 240 is controlled to be 100% (completely opened), if the learning voltage value is higher than the maximum input voltage required for the control, it is determined that the failure occurs. The failure means a case in which a failure of a sensor for sensing the waste gate valve 240 position occurs, such that the learning voltage is higher than the originally predetermined reference voltage.

Further, preferably, like the case in which the information on the failure of the power stage is present, the corresponding diagnosis result may be notified to the driver, or the like as a failure notification signal such as a voice message or a text message so that the driver, or the like may confirm failure details of the turbo-charger 200.

According to the method for diagnosing a failure of a power stage of an EWGA in accordance with the present invention, it is possible to rapidly determine whether the failure of the power stage of the EWGA occurs in the entire driving cycle.

Further, according to the method for diagnosing a failure of a power stage of an EWGA in accordance with the present invention, it is possible to solve problems such as the failure of the ECU due to the failure of the power stage that is maintained for a long time, thereby decreasing expenses generated due to additional replacement of components.

Further, according to the method for diagnosing a failure of a power stage of an EWGA in accordance with the present invention, it is possible to accurately determine whether the abnormal learning value is caused by the failure of the power stage when the learning value is abnormal at the time of EWGA position learning, such that the valve may not be unnecessarily replaced, thereby decreasing maintenance costs for a vehicle.

The preferred embodiments of the present invention have been described, but the present invention is not limited to the embodiment, but may be easily modified by a person having ordinary skill in the field of technology to which the present invention pertains, and include all modifications equivalent to the claims.

What is claimed is:

1. A method for diagnosing a failure of a power stage of an electronic waste gate actuator (EWGA), the method comprising:
    confirming, by an engine control unit (ECU), information on a failure of the power stage, the information transferred from an EWGA driver IC at a time of EWGA position learning, after an engine is turned off; and
    determining whether the failure of the power stage of the EWGA has occurred based on the information;
    wherein an input voltage applied to the EWGA is less than a predetermined minimum value at the time of the learning, the method further comprising transferring, by the EWGA driver IC, information on a disconnection of the power stage to the ECU.

2. The method of claim 1, wherein determining whether the failure of the power stage of the EWGA has occurred comprises determining that the failure of the power stage of the EWGA has occurred, the method further comprises notifying a driver of an occurrence of the failure of the power stage through an alarm message.

3. The method of claim 1, wherein determining whether the failure of the power stage of the EWGA has occurred comprises determining that the failure of the power stage of the EWGA has occurred, the method further comprises comparing a learning voltage applied for the EWGA position learning with a predetermined reference value to determine whether the learning voltage is abnormal.

4. The method of claim 3, further comprising determining that a failure of a turbo-charger has occurred when a current learning voltage is lower than a minimum input voltage required to control a waste gate valve at a predetermined opening degree.

5. The method of claim 4, wherein a failure of the turbo-charger has occurred, the method further comprising notifying a driver of failure details of the turbo-charger through an alarm message.

6. The method of claim 3, further comprising determining that a failure of a turbo-charger has occurred when a current learning voltage is higher than a maximum input voltage required to control a waste gate valve at a predetermined opening degree.

7. The method of claim 6, further comprising, when it is determined that the failure of the turbo-charger has occurred, notifying a driver of failure details of the turbo-charger through an alarm message.

8. The method of claim 1, further comprising confirming that the information on the failure of the power stage is present when a learning result deviates from a normal range at the time of EWGA position learning.

9. A vehicle comprising:
a turbo-charger that includes a waste gate valve;
an electronic waste gate actuator (EWGA) mounted in the turbo-charger to control the waste gate valve depending on driving conditions; and
an engine control unit (ECU) that includes an EWGA driver IC to control the EWGA, the engine control unit configured to diagnose a failure of a power stage of the EWGA, wherein whether the failure of the power stage of the EWGA occurs is determined by confirming, by the ECU, information on the failure of the power stage transferred from the EWGA driver IC of the ECU at a time of EWGA position learning, after an engine is turned;
wherein the EWGA driver IC is configured to transfer information on a disconnection of the power stage to the ECU when an input voltage applied to the EWGA is less than a predetermined minimum value at the time of the learning, and to transfer information on short-circuit of the power stage to the ECU when the input voltage applied to the EWGA is higher than a predetermined maximum value at the time of the learning.

10. A method for diagnosing a failure of a power stage of an electronic waste gate actuator (EWGA), the method comprising:
confirming, by an engine control unit (ECU), information on a failure of the power stage, the information transferred from an EWGA driver IC at a time of EWGA position learning, after an engine is turned off; and
determining whether the failure of the power stage of the EWGA has occurred based on the information;
wherein an input voltage applied to the EWGA is higher than a predetermined maximum value at the time of the learning, the method further comprising transferring, by the EWGA driver IC, information on short-circuit of the power stage to the ECU.

11. The method of claim 10, wherein determining whether the failure of the power stage of the EWGA has occurred comprises determining that the failure of the power stage of the EWGA has occurred, the method further comprises notifying a driver of an occurrence of the failure of the power stage through an alarm message.

12. The method of claim 10, wherein determining whether the failure of the power stage of the EWGA has occurred comprises determining that the failure of the power stage of the EWGA has occurred, the method further comprises comparing a learning voltage applied for the EWGA position learning with a predetermined reference value to determine whether the learning voltage is abnormal.

13. The method of claim 12, further comprising determining that a failure of a turbo-charger has occurred when a current learning voltage is lower than a minimum input voltage required to control a waste gate valve at a predetermined opening degree.

14. The method of claim 13, wherein a failure of the turbo-charger has occurred, the method further comprising notifying a driver of failure details of the turbo-charger through an alarm message.

15. The method of claim 12, further comprising determining that a failure of a turbo-charger has occurred when a current learning voltage is higher than a maximum input voltage required to control a waste gate valve at a predetermined opening degree.

16. The method of claim 15, further comprising, when it is determined that the failure of the turbo-charger has occurred, notifying a driver of failure details of the turbo-charger through an alarm message.

17. The method of claim 10, further comprising confirming that the information on the failure of the power stage is present when a learning result deviates from a normal range at the time of EWGA position learning.

* * * * *